United States Patent
Huang et al.

(10) Patent No.: US 11,635,695 B2
(45) Date of Patent: Apr. 25, 2023

(54) METHOD FOR REDUCING LINE-END SPACE IN INTEGRATED CIRCUIT PATTERNING

(71) Applicant: Taiwan Semiconductor Manufacturing Co., Ltd., Hsin-Chu (TW)

(72) Inventors: Jing-Huei Huang, Yilan County (TW); Ya-Wen Chiu, Hsinchu (TW); Lun-Kuang Tan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 289 days.

(21) Appl. No.: 16/901,505

(22) Filed: Jun. 15, 2020

(65) Prior Publication Data

US 2021/0389679 A1 Dec. 16, 2021

(51) Int. Cl.
*G03F 7/20* (2006.01)
*H01J 37/317* (2006.01)
*H01L 21/266* (2006.01)
*H01L 21/265* (2006.01)
*H01J 37/305* (2006.01)

(52) U.S. Cl.
CPC ...... *G03F 7/70033* (2013.01); *H01J 37/3056* (2013.01); *H01J 37/317* (2013.01); *H01L 21/266* (2013.01); *H01L 21/26586* (2013.01)

(58) Field of Classification Search
CPC . G03F 7/70033; H01J 37/3056; H01J 37/317; H01J 2237/0213; H01J 2237/20207; H01J 2237/316; H01J 2237/31701; H01L 21/31144; H01L 21/0273; H01L 21/3086; H01L 21/4846; H01L 21/76816; H01L 21/266; H01L 21/26586
See application file for complete search history.

(56) References Cited

U.S. PATENT DOCUMENTS

| | | | | |
|---|---|---|---|---|
| 5,091,655 A | * | 2/1992 | Dykstra | H01J 37/3171 250/398 |
| 5,344,787 A | * | 9/1994 | Nagalingam | H01L 21/26586 257/E21.345 |
| 8,133,804 B1 | * | 3/2012 | Godet | H01J 37/3056 438/528 |
| 9,245,788 B2 | * | 1/2016 | Tseng | H01L 21/76829 |

(Continued)

*Primary Examiner* — Dale E Page
*Assistant Examiner* — Quovaunda Jefferson
(74) *Attorney, Agent, or Firm* — Haynes and Boone, LLP

(57) ABSTRACT

A method includes forming a resist pattern, the resist pattern having trenches oriented lengthwise along a first direction and separated by resist walls along both the first direction and a second direction perpendicular to the first direction. The method further includes loading the resist pattern into an ion implanter so that a top surface of the resist pattern faces an ion travel direction, and tilting the resist pattern so that the ion travel direction forms a tilt angle with respect to an axis perpendicular to the top surface of the resist pattern. The method further includes rotating the resist pattern around the axis to a first position; implanting ions into the resist walls with the resist pattern at the first position; rotating the resist pattern around the axis by 180 degrees to a second position; and implanting ions into the resist walls with the resist pattern at the second position.

20 Claims, 17 Drawing Sheets

(56) References Cited

U.S. PATENT DOCUMENTS

| | | |
|---|---|---|
| 10,276,372 B2 | 4/2019 | Shih et al. |
| 2002/0037460 A1* | 3/2002 | Takahashi ........... G03F 7/70716 430/30 |
| 2014/0272728 A1 | 9/2014 | Sinclair et al. |
| 2017/0338103 A1* | 11/2017 | Shih .................... H01L 21/0273 |

* cited by examiner

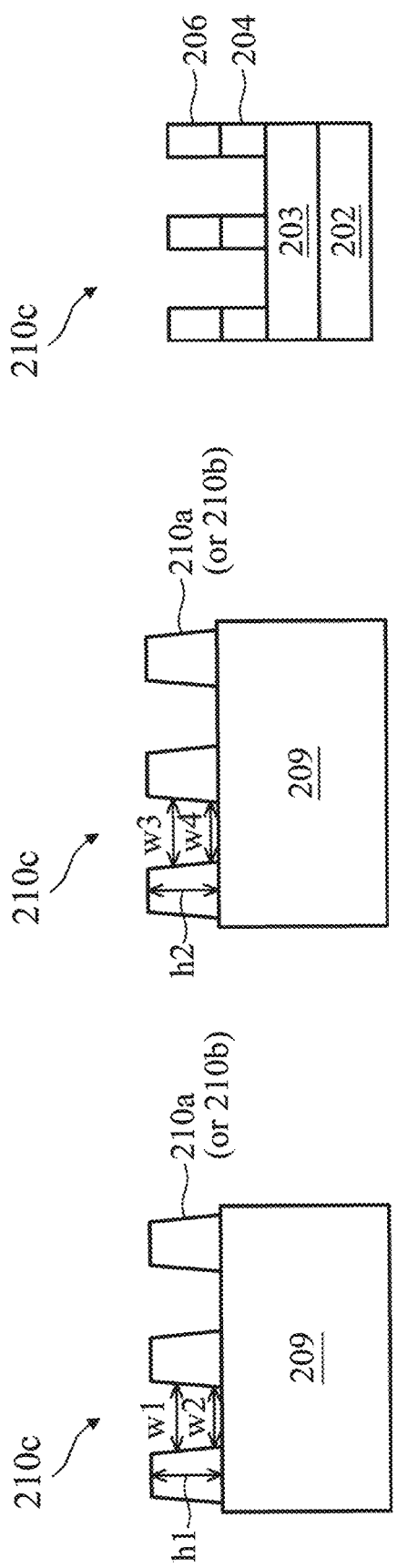
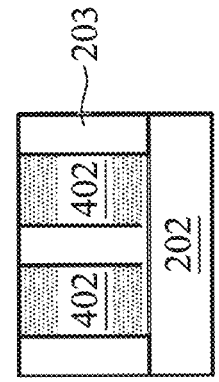
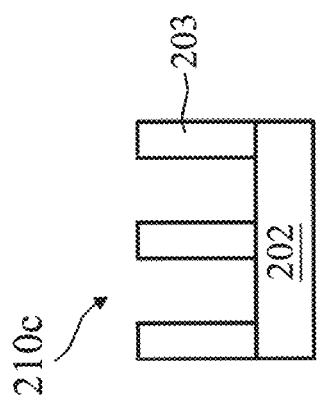
FIG. 12A  FIG. 12B  FIG. 12C  FIG. 12D  FIG. 12E

METHOD FOR REDUCING LINE-END SPACE IN INTEGRATED CIRCUIT PATTERNING

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, lithography is a technique frequently used in IC manufacturing for transferring IC designs to a semiconductor substrate. A typical lithography process includes coating a resist (or photoresist or photo resist) over a substrate, exposing the resist to a radiation such as deep ultraviolet (DUV) ray or extreme ultraviolet (EUV) ray, and developing and partially stripping the resist to leave a patterned resist (or resist pattern) over the substrate. The patterned resist is then used in subsequent etching processes in forming ICs. With the continued IC miniaturization, even the resolution of EUV lithography (e.g., pitch≤35 nm) may be insufficient to meet the design requirements in some cases, particularly when both 1D dimensions (e.g., line width) and 2D dimensions (e.g., line end to line end space) are considered. This is because processes of reducing 1D dimensions sometimes increase 2D dimension simultaneously. Accordingly, advancement in lithography process is generally desirable to meet the demand of the continued semiconductor miniaturization.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 12A and 12B illustrate cross-sectional views of resist patterns before and after the treatment according to embodiments of the present disclosure.

FIGS. 12C, 12D, and 12E illustrate cross-sectional views of forming a target pattern and forming a circuit pattern according to embodiments of the present disclosure.

DETAILED DESCRIPTION

Figure 1A:
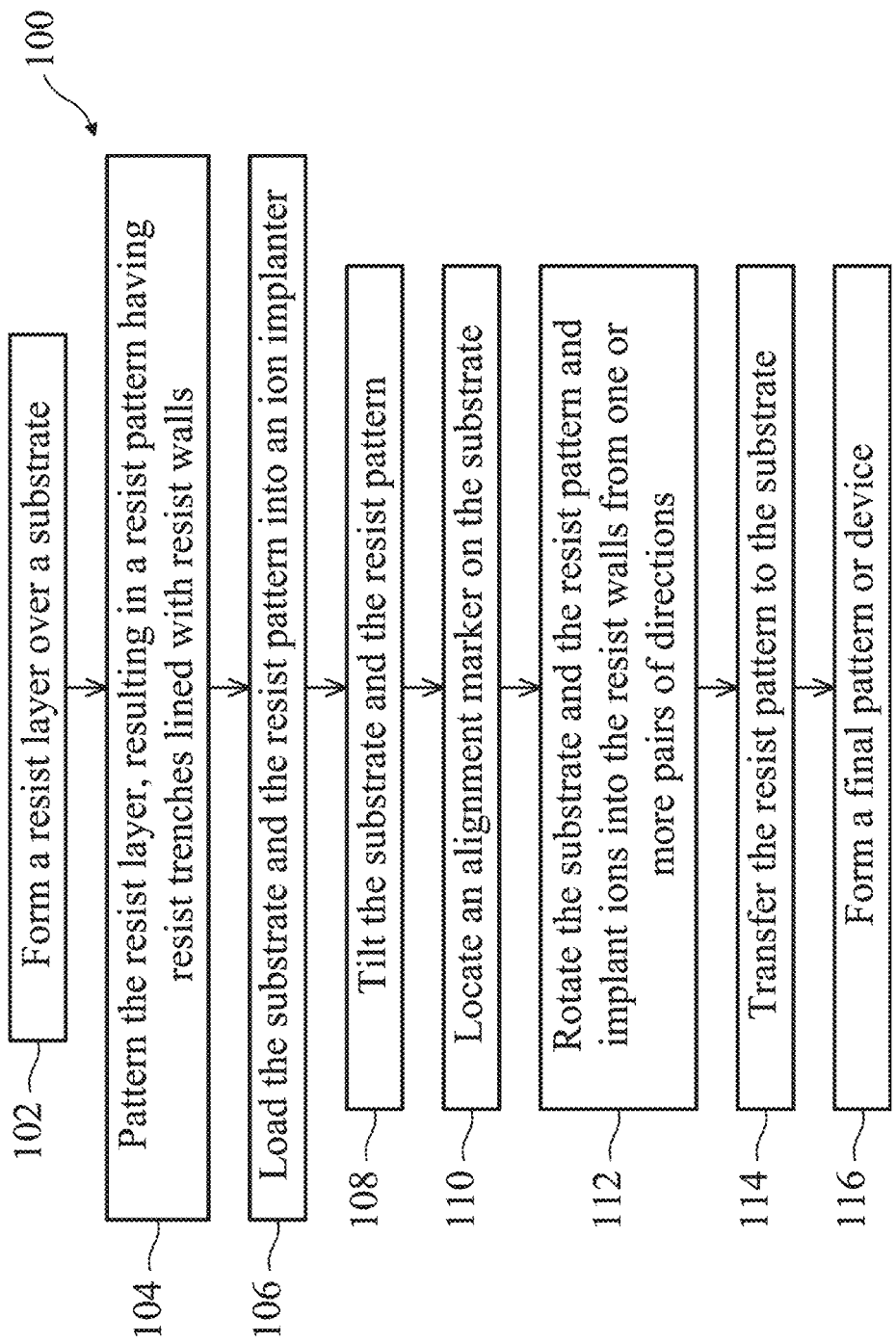
FIGS. 1A, 1B, 1C, and 1D show various flow charts of a method of forming a target pattern on a substrate for implementing one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to forming a pattern or device for an integrated circuit (IC) using a lithography process and more particularly, to methods of treating a patterned resist layer (or a resist pattern) with ion implantation from one or more pairs of opposite directions so as to reduce a dimension of the resist pattern (corresponding to a line end to line end space in a metal layer) without (or insignificantly) enlarging another dimension of the resist pattern (corresponding to line width in a metal layer). The processed resist pattern is used in subsequent etching processes, which eventually lead to the formation of metal lines in a metal layer or the formation of other circuit features, such as silicon fins. The disclosed methods may be used in conjunction with EUV lithography to achieve direct patterning for advanced process nodes with just one lithography patterning process and one etching process (so-called 1P1E) or can be used with EUV or other lithography processes for enlarging process window during double patterning processes (e.g., two lithography patterning and two etching processes or so-called 2P2E processes).

FIG. 1A shows a flow chart of a method 100 for forming a target pattern or device according to various aspects of the present disclosure. Additional operations can be provided before, during, and after the method 100, and some operations described can be replaced, eliminated, or moved around for additional embodiments of the method. The method 100 is an example and is not intended to limit the present disclosure beyond what is explicitly recited in the claims. The method 100 is described below in conjunction with FIGS. 2-10.

Figure 2:
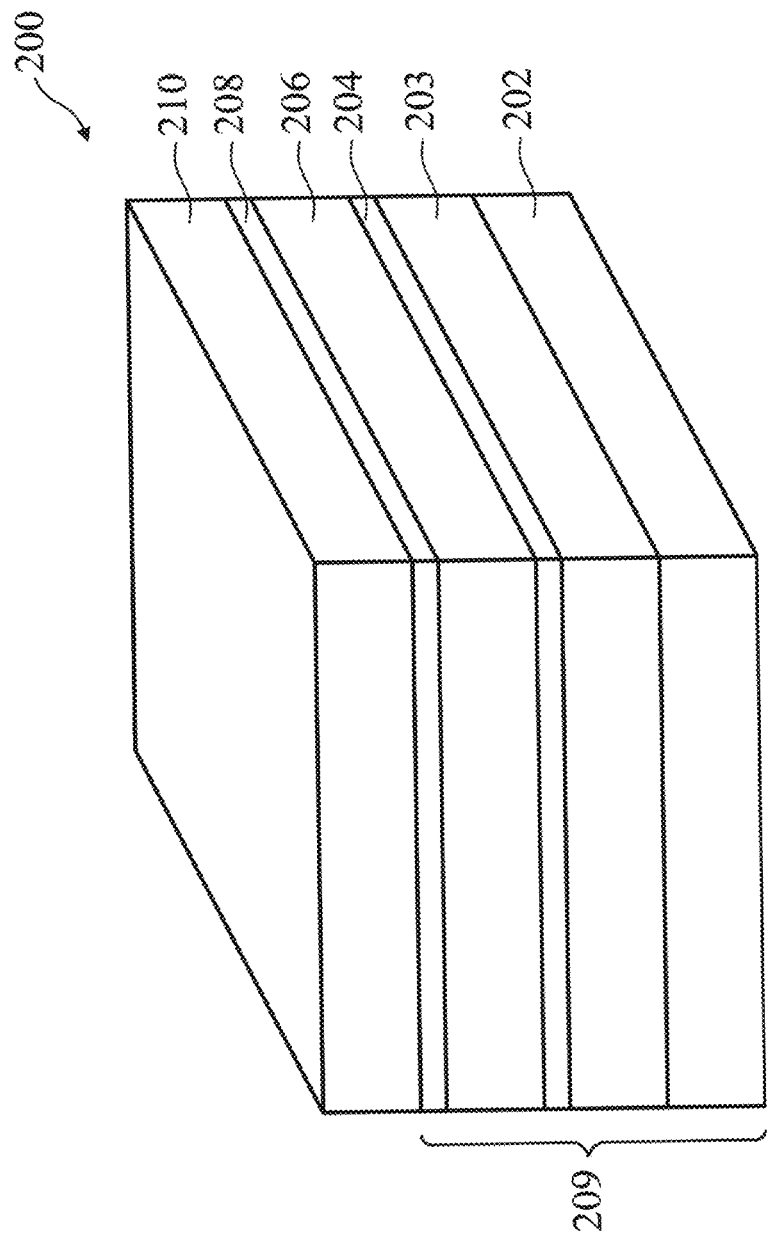
FIGS. 2, 3, and 4 illustrate three dimensional views of forming a target pattern according to the method of FIG. 1A, in accordance with some embodiments.

At operation 102, the method 100 (FIG. 1A) forms a resist layer 210 over a structure 209 as shown in FIG. 2. Referring to FIG. 2, in various embodiments, the structure 209 includes a substrate 202 and various layers thereon. The substrate 202 includes one or more material layers and is in an intermediate step of a fabrication process to form a device 200.

The device 200 may be an IC, or a portion thereof, that may comprise static random access memory (SRAM) and/or other logic circuits, passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. The device 200 may include three-dimensional devices and multi-gate devices such as double gate FETs, FinFETs, tri-gate FETs, omega FETs, Gate-All-Around (GAA) devices, and vertical GAA devices.

In an embodiment, the substrate 202 is a semiconductor substrate (e.g., silicon wafer). In an embodiment, the substrate 202 includes silicon in a crystalline structure. In alternative embodiments, the substrate 202 includes other elementary semiconductors such as germanium, or a compound semiconductor such as silicon carbide, gallium arsenide, indium arsenide, and indium phosphide. The substrate 202 may include a silicon on insulator (SOI) substrate, be strained/stressed for performance enhancement, include epitaxial regions, include isolation regions, include doped regions, include one or more semiconductor devices or portions thereof (such as fins, nanowire, nanosheet), include conductive (such as source, drain, gate, contacts, etc.) and/or non-conductive layers, and/or include other suitable features and layers.

The various layers between the substrate 202 and the resist layer 210 include a dielectric layer 203, a hard mask layer 204, a bottom material layer 206, and an anti-reflection coating (ARC) layer 208 in this embodiment. In various embodiments, some of the material layers 203, 204, 206, and 208 may be omitted and/or substituted, or alternatively, other material layers may be added between the resist layer 210 and the substrate 202. In an embodiment, the resist layer 210 is formed by a spin coating process followed by a soft baking process.

In an embodiment, the dielectric layer 203 includes a dielectric material such as silicon oxide, silicon nitride, silicon oxynitride, tetraethyl orthosilicate (TEOS), phosphosilicate glass (PSG), low-k dielectric material, other suitable dielectric material, or combinations thereof. In an embodiment, the dielectric layer 203 is an interlayer dielectric (ILD) layer where metal lines will be formed therein. To further this embodiment, the resist layer 210 will be patterned with trenches which are subsequently transferred to the dielectric layer 203. The trenches in the dielectric layer 203 are filled with one or more metals to form the metal lines. In some embodiments, the dielectric layer 203 is formed by a flowable CVD (FCVD) process that includes, for example, depositing a flowable material (such as a liquid compound) over the substrate 202 and converting the flowable material to a solid material by a suitable technique, such as thermal annealing and/or ultraviolet radiation treating. The dielectric layer 203 can include a multilayer structure having multiple dielectric materials. For example, the dielectric layer 203 may include a TEOS layer of 30 nm thick over another low-k oxide layer of about 170 nm to 200 nm thick.

In various embodiments, the hard mask layer 204 may use amorphous silicon (a-Si), silicon oxide, silicon nitride, titanium nitride, silicon oxynitride, silicon carbide nitride, or other suitable material or composition; the bottom material layer 206 may contain silicon, oxygen, and/or carbon, such as spin-on glass (SOG); the ARC layer 208 may be a polymeric material layer (e.g., containing carbon, hydrogen, and oxygen for enhancing adhesion of the resist 210) or a silicon-containing material layer, such as amorphous silicon, silicon oxide, silicon oxygen carbide, and plasma enhanced chemical vapor deposited silicon oxide. The various material layers 204, 206, and 208 may be formed by a variety of processes. For example, they may be formed by chemical vapor deposition (CVD), low pressure chemical vapor deposition (LPCVD), plasma enhanced chemical vapor deposition (PECVD), physical vapor deposition (PVD), atomic layer deposition (ALD), or other suitable deposition method.

The resist layer 210 can be a positive resist or a negative resist. A positive resist is normally insoluble in a resist developer, but is made soluble by exposure to a radiation such as a deep ultraviolet (DUV) ray, an extreme ultraviolet (EUV) ray, an electron beam (e-beam), an x-ray, or other suitable radiation. One exemplary positive resist material is chemically amplified resist (CAR) that contains backbone polymer protected by acid labile groups (ALGs). A negative resist has the opposite behavior—normally soluble in a resist developer, but is made insoluble by exposure to a radiation, such as a DUV ray, an EUV ray, an e-beam, an x-ray, or other suitable radiation. One exemplary negative resist is a polymer which forms intra-molecular and/or intermolecular cross links when irradiated, such as a polymerization of Ethyl($\alpha$-hydroxy)acrylate (EHMA) and methacryl acid (MAA).

At operation 104, the method 100 (FIG. 1A) patterns the resist layer 210 thereby forming a resist pattern. For the sake of convenience, the resist pattern is referred to as resist pattern 210. In an embodiment, the patterning process transfers a pattern from a mask (or a photo-mask or a reticle) to the resist layer 210. Alternatively, the patterning process may use a maskless patterning technique such as electron beam direct writing (EBDW). In an embodiment, patterning the resist layer 210 includes exposing the resist layer 210 to a radiation, post-exposure baking, developing the resist layer 210 in a resist developer, and hard baking thereby removing exposed portions (or unexposed portions in the case of a negative resist) of the resist layer 210 and leaving unexposed portions thereof (or exposed portions thereof in the case of a negative resist) on the ARC layer 208 as the resist pattern 210. The radiation may be a DUV ray, an EUV ray, an e-beam, an x-ray, an ion beam, or other suitable radiation. In embodiments where a mask is used to pattern the resist layer 210, the mask can be of different types, such as a transmissive mask or a reflective mask, and can be formed in various technologies, such as binary mask or phase shift mask (PSM). In one example, a binary mask includes a transparent substrate (e.g., fused quartz), and an opaque material (e.g., chromium) coated in the opaque regions of the mask. In another example, a PSM includes various features configured to have proper phase difference to enhance the resolution and imaging quality. In the present embodiment, the patterning process transfers a pattern from a reflective mask to the resist layer 210 using EUV lithography (i.e., it uses EUV radiation for exposure).

Figure 3:
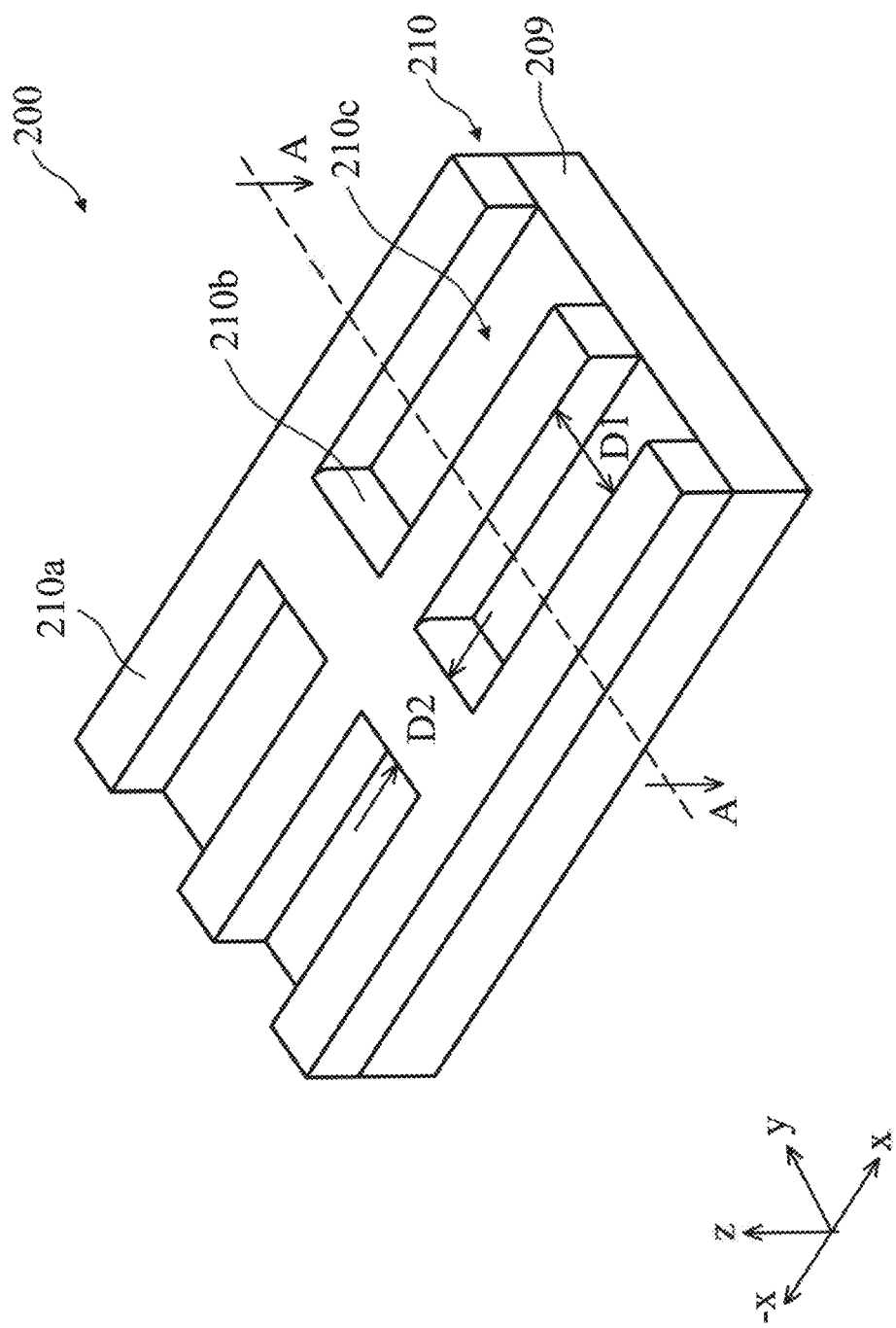

In the present example as shown in FIG. 3, the resist pattern 210 includes line patterns 210a and 210b. Particularly, the line patterns 210a (three shown in FIG. 3) are oriented lengthwise along the X direction, the line patterns 210b (one shown in FIG. 3) are oriented lengthwise along the Y direction that is perpendicular to the X direction. The line patterns 210a and 210b intersect to form resist trenches 210c. Since the line patterns 210a and 210b act as walls for the trenches 210c, they are also referred to as resist walls 210a and 210b respectively. In the present example, the line patterns 210a and 210b are used for simplification and ease of understanding and do not necessarily limit the embodiment to any number of line patterns, any arrangement of line pattern, and/or other types of patterns such as trench patterns, hole patterns, patterns with bends, and so on.

As discussed earlier, the trenches 210c will be transferred to the layer 203 in the structure 209. The dimensions of the trenches 210c substantially correspond to the dimensions of metal lines formed in the layer 203. For example, the width of the trench 210c (dimension D1) corresponds to the width of metal lines, and the distance between ends of two trenches 210c along the X direction (dimension D2) corresponds to an end-to-end spacing of two metal lines. As miniaturization of the device 200 continues, it's desirable to have both dimensions D1 and D2 to be reduced. However, the size of the dimensions D1 and D2 is limited by the resolution of the lithography process used for exposing the resist layer 210. For example, using existing EUV lithography, the dimension D2 is limited to about 30 nm or larger, and the dimension D1 is limited to about 18 nm or larger (about half of the pitch of the line patterns 210a). For designs that demand smaller dimensions, particularly smaller D2, further processes are needed. The present disclosure introduces such a process which includes operations 106 through 112 of FIG. 1A. The process substantially reduces the dimension D2 and slightly enlarges dimension D1 by directly trimming the line patterns 210b (and sometimes trimming the line patterns 210a as well) using ion implantation. This is further discussed below.

Figure 11A:
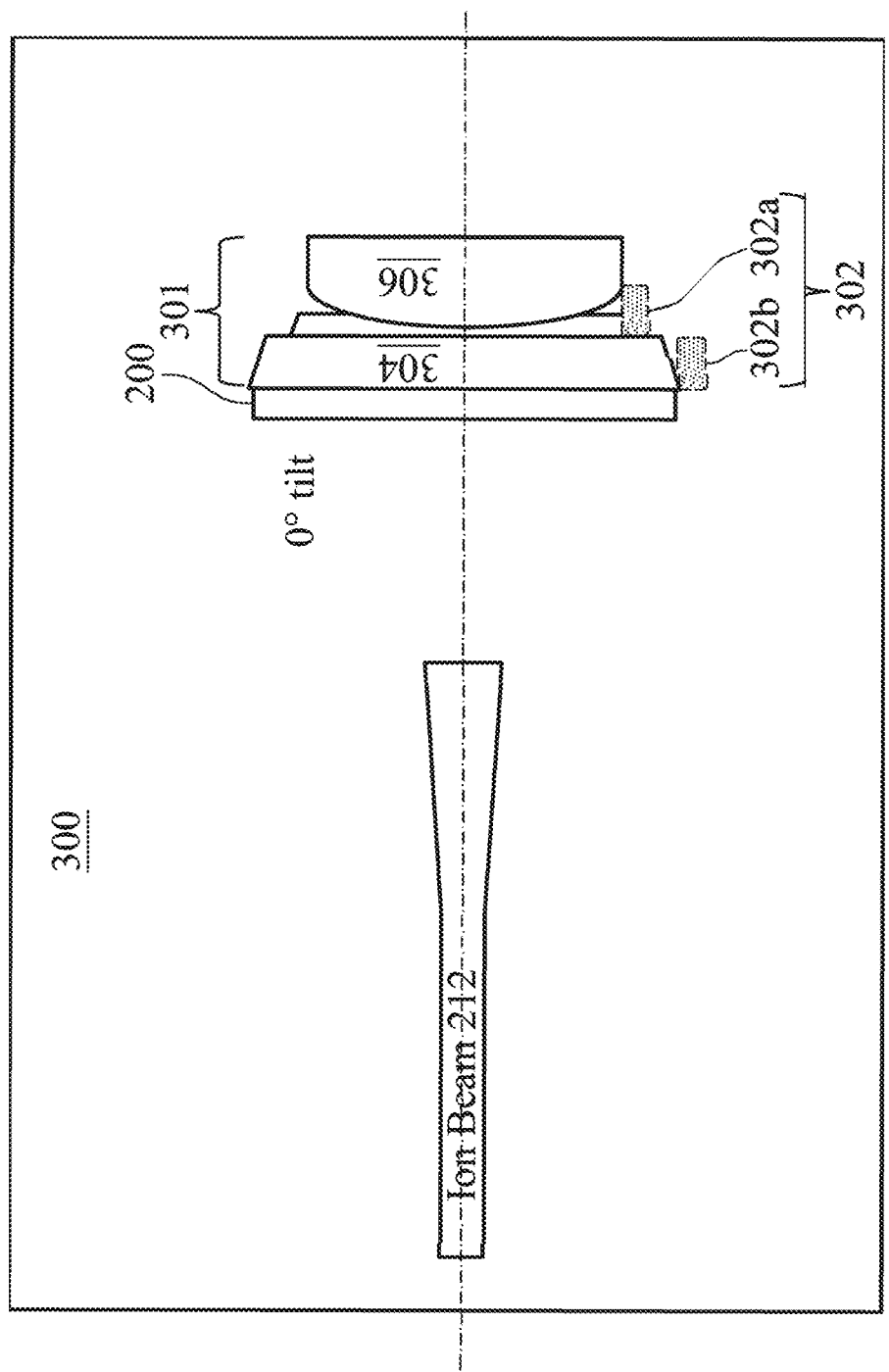
FIGS. 11A and 11B illustrate tilting a structure in an ion implanter during one or more embodiments of the present disclosure.

At operation 106, the method 100 (FIG. 1A) loads the device 200 (having the resist pattern 210 and the structure 209) into an ion implanter 300. For example, the device 200 may be attached to a platen 304 that is mounted on a roplat assembly 306 as shown in FIG. 11A. The platen 304 and the roplat assembly 306 are part of an apparatus 301 that is installed in an ion implanter 300. The roplat assembly 306 is operable to rotate and tilt the platen 304 together with the device 200. The apparatus 301 further includes a shield 302 for protecting the platen 304 and the roplat assembly 306 (which may include metal elements) from ion bombardments. The shield 302 will be further discussed in a later section of the disclosure.

The ion implanter 300 is provided with one or more ion beams 212. In the present embodiment, the ion beam 212 is a focused beam of ions and can be direct to the device 200 substantially along a direction (ion travel direction). When the device 200 is initially loaded into the ion implanter 300, the ion beam 212 is not applied to the device 200 (i.e., it is turned off). In an embodiment, the device 200 is installed at an initial position where it directly faces the ion travel direction of the ion beam 212. In other words, the ion travel direction and the normal to the top surface of the device 200 are aligned and form a tilt angle of 0 degree. In alternative embodiments, the device 200 is installed at an initial position where it does not directly face the ion travel direction of the ion beam 212. Rather, the ion travel direction and the normal to the top surface of the device 200 forms a tilt angle that is greater than 0 degree, such as 10 degrees.

Figures 4, 5:
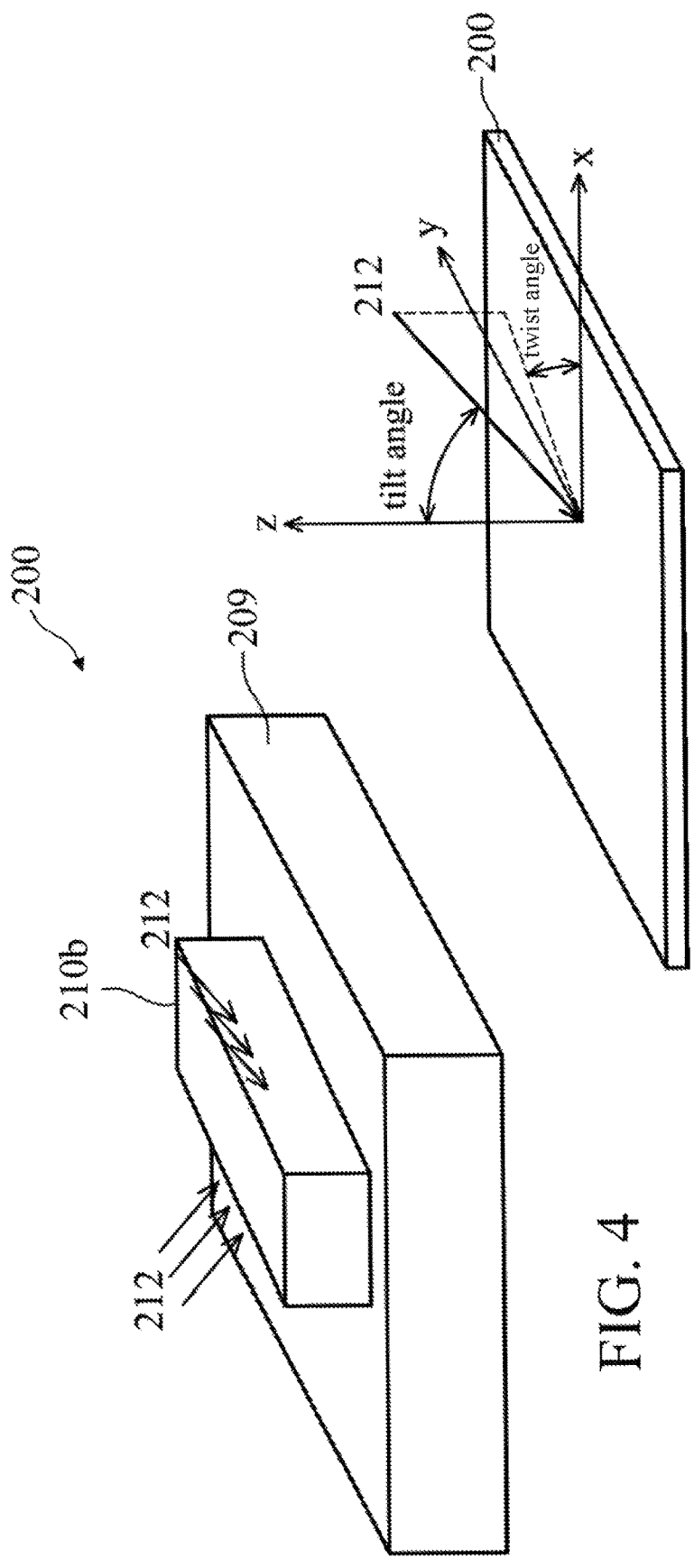
FIG. 5 illustrates ion beam tilt angle and twist angle during ion implantation in operations of the method of FIG. 1A.

FIGS. 4 and 5 further illustrate the concept of the tilt angle and a twist angle of the ion beam 212 with respect to the device 200. FIG. 4 illustrates that the ion beam 212 is directed towards a resist pattern 210 from both sides. FIG. 5 illustrates that the ion beam 212 and the normal (Z axis) to the top surface of the device 200 form a tilt angle in a plane that contains both the normal and the ion beam 212. FIG. 5 also illustrates that the plane containing both the normal and the ion beam 212 and the X-Z plane form a twist angle.

Figure 11B:
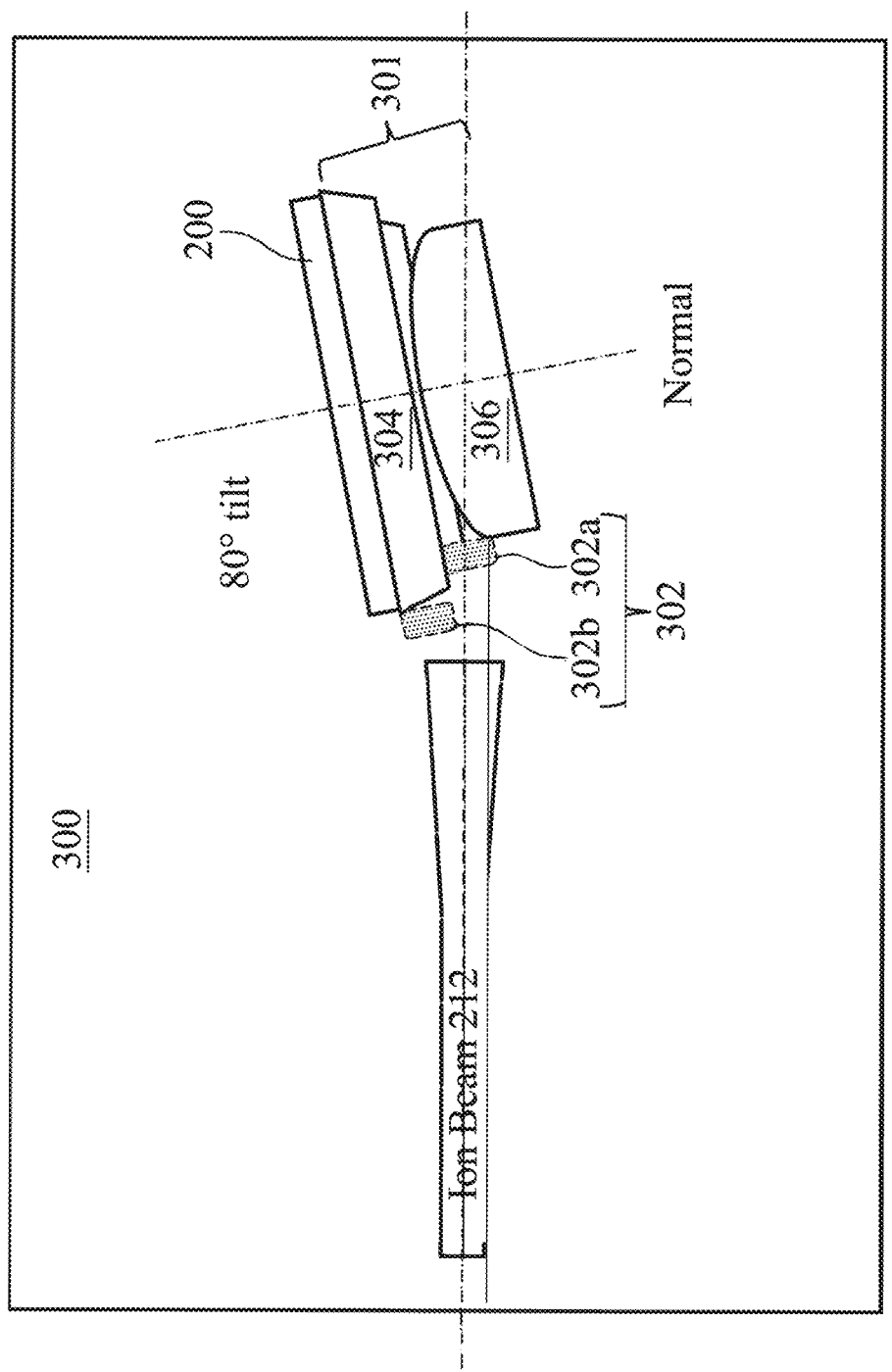

At operation 108, the method 100 (FIG. 1A) tilts the device 200 so that the ion travel direction and the normal to the top surface of the device 200 form a tilt angle. In an embodiment, the tilt angle is at least 40 degrees, such as at least 60 degrees, or in a range from 60 degrees to 80 degrees. In another embodiment, the tilt angle may be smaller than 40 degrees. As illustrated in FIG. 4 and in later figures, the ion beam 212 is used for trimming the sidewalls of the resist walls 210b (and sometimes resist walls 210a as well). A larger tilt angle allows the ions to more directly hit the sidewalls than to hit the top surface of the resist walls 210b. This prevents or reduces the loss of the height of the resist pattern 210. A taller resist pattern 210 is more desirable because it is used as an etch mask when the under layers (such as the layers 208, 206, 204, and/or 203) are etched. Therefore, a larger tilt angle is generally more desirable than a smaller tilt angle. However, because there are many resist lines 210 in the resist pattern, a shadow effect exists where one resist line blocks (completely or partially) the ions from reaching another resist line behind it if the tilt angle is too big (e.g., approaching 90 degrees). Therefore, in embodiments of the present disclosure, a tilt angle in a range of 40 degrees to 80 degrees is generally adequate for trimming the resist lines 210 while reducing the loss of height thereof. Still further, the resist trenches 210c are designed to be long trenches along the X direction in the present embodiment, which allows the tilt angle to be large, such as in the range of 40 degrees to 80 degrees or in the range of 60 degrees to 80 degrees. If the resist trenches 210c are short, then they would introduce a large shadow effect and would not allow a large tilt angle to be implemented effectively. FIG. 11B illustrates an embodiment where the device 200 is tilted so that the ion beam tilt angle is about 80 degrees. It is noted that tilting is a relative term. In various embodiment, the operation 108 may tilt the ion beam 212 instead of tilting the device 200 to achieve the ion beam tilt angle discussed above.

At operation 110, the method 100 (FIG. 1A) locates an alignment marker on the device 200 and aligns the alignment marker with the ion travel direction. In other words, the operation 110 rotates the device 200 such that the alignment marker is in the plane that contains the ion travel direction and the normal to the top surface of the device 200. In an embodiment, the alignment marker is a notch on a wafer 202, such as the notch 222 in FIG. 6B. In an embodiment, the substrate 202 is a silicon wafer, such as a silicon (100) wafer, and the notch 222 indicates the silicon <110> direction. It is noted that the direction or plane that is perpendicular to the silicon <110> direction in a silicon (100) wafer is another silicon <110> direction. In an alternative embodiment, the alignment marker is a flat (rather than a notch) on a wafer. For example, in some embodiments, a flat is used to indicate the silicon <110> direction of a silicon (100) wafer. In an embodiment, the lengthwise direction of the resist lines 210a and the resist trenches 210c (which is the direction X in the example shown in FIG. 3) is aligned with (or parallel to) the direction indicated by the alignment marker. For example, the lengthwise direction of the resist lines 210a and the resist trenches 210c is aligned with (or parallel to) the silicon <110> direction of a silicon (100) wafer. In another embodiment, the lengthwise direction of the resist lines 210a and the resist trenches 210c is perpendicular to the direction indicated by the alignment marker. As noted above, this direction is also a silicon <110> direction in a silicon (100) wafer. The orientation of the resist trenches in silicon <110> direction assists in the exposure and patterning process as well as enabling high performance circuits to be made in the device 200. In some embodiments, the resist trenches 210c may be formed with an angle between 0 degree and 90 degrees with respect to the direction indicated by the alignment marker (e.g., offset from the silicon <110> direction in a silicon (100) wafer). The present disclosure can handle those embodiments as well. After locating the alignment marker and with the knowledge of the resist trench orientation (e.g., parallel to, perpendicular to, or offset from the direction indicated by the alignment marker), the method 100 learns the orientation of the resist trench 210c relative to the ion beam 212.

In some embodiments, the method 100 may perform the operation 108 before the operation 110 or vice versa.

At operation 112, the method 100 (FIG. 1A) rotates the device 200 with the resist pattern 210 and implant ions into the resist walls 210b (sometimes into the resist walls 210a as well) from one or more pairs of directions to trim the thickness of the resist walls 210b. Each pair of the directions are selected to be opposing each other. For example, one direction is along the X direction and the other direction in the pair is along the -X direction. One goal is to reduce the dimension D2 while not enlarging (or insignificantly enlarging) the dimension D1. Various example embodiments of operation 112 are further described with reference to FIGS. 1B, 1C, and 1D.

Figure 1B:
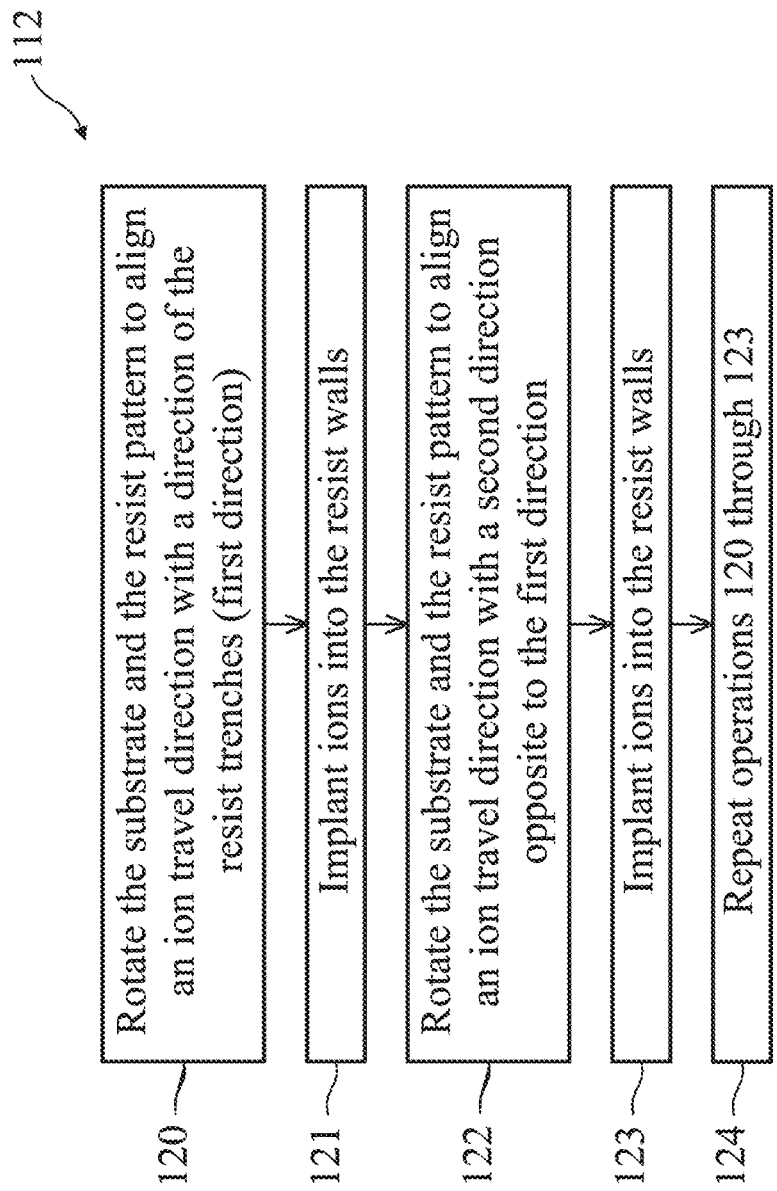
Figure 6A:
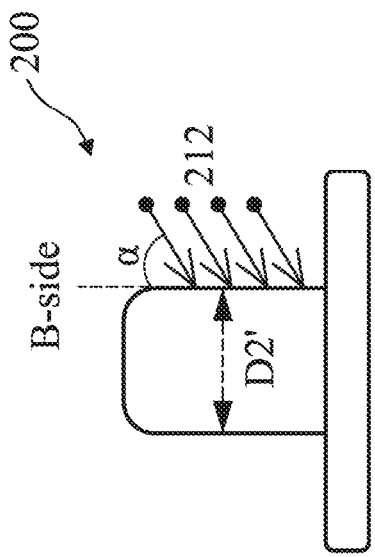
FIGS. 6A and 6B illustrate side view and top view of processing a target pattern for implementing an embodiment of the present disclosure.
Figure 6B:
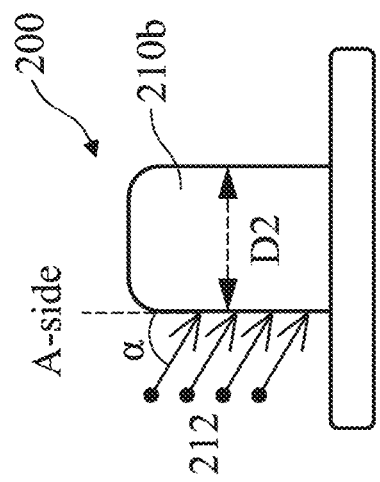

Referring to FIG. 1B, at operation 120, the method 100 rotates the device 200 to align the ion travel direction of the ion beam 212 with the lengthwise direction of the resist trenches 210c (i.e., the X direction in FIG. 3 and FIG. 6B). Meanwhile, the resist walls 210b is tilted with respect to the ion travel direction of the ion beam 212 at a tilt angle α. FIG. 6A illustrates a side view of a resist wall 210b forming the tilt angle α with respect to the travel direction of the ion beam 212. FIG. 6B illustrates a top view of the resist trenches 210c aligned with the travel direction of the ion beam 212. In this embodiment, the lengthwise direction of the resist trenches 210c is also aligned with the direction indicated by the alignment marker 222. Thus, the device 200 is rotated by 0 degree (i.e., not rotated) from the position achieved by the operation 110. The tilt angle α is in a range of 40 degrees to 80 degrees, such as from 60 degrees to 80 degrees, as discussed above.

At operation 121, the method 100 (FIG. 1B) implants ions (or ion species) into the resist walls 210b. It may also implant ions into the resist walls 210a incidentally. In various embodiments, the ion species may be one or more of the following: arsenic, boron, carbon, indium, difluoroboryl ($BF_2$), germanium, gallium, fluorine, nitrogen (both N_14 and N_28), oxygen, phosphorus, silicon, xenon, argon, and $SiF_3$. The implant energy may be in a range of 0.1K eV to 60K eV for single charged ion species, in a range of 0.1K eV to 120K eV for double charged ion species, in a range of 0.1K eV to 180K eV for triple charged ion species, and so on. The total ion dose may be from about $2 \times e^{12}$ ions/cm$^2$ to about $9 \times e^{16}$ ions/cm$^2$ depending on the ion species. The total ion dose may be divided equally based on the number of applications of the ion implantation. For example, in the flow chart shown in FIG. 1B, if the operation 112 has only two applications of the ion implantation (i.e., only the operations 121 and 123 and without repetition), then, the total ion dose may be divided equally by 2 with half ion dose applied during the operation 121 and the other half applied during the operation 123. For example, if the operation 112 has four applications of the ion implantation (i.e., each of the operations 121 and 123 is executed twice), then the total ion dose may be divided equally by 4 with a quarter dose applied during each of the operations 121 and 123. The implanted ion species cause the resist walls 210b to retreat by physical forces, chemical reaction, or both. They also reduce the resist walls' line edge roughness and line width roughness.

Figure 6C:
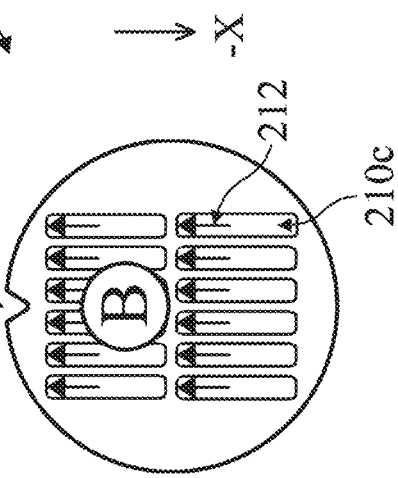
FIGS. 6C and 6D illustrate side view and top view of processing a target pattern for implementing an embodiment of the present disclosure.
Figure 6D:
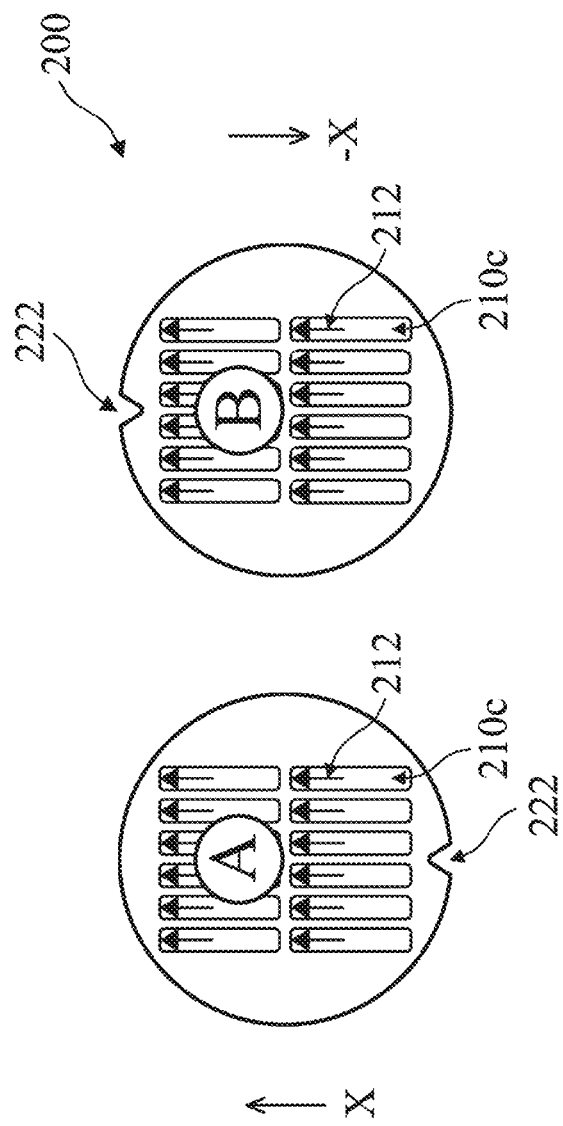

At operation 122, the method 100 (FIG. 1B) rotates the device 200 to align the ion travel direction of the ion beam 212 with a direction that is opposite to the direction of operation 120 (i.e., the -X direction in FIG. 3 and FIG. 6D). Notably, it is also a lengthwise direction of the resist trenches 210c. Meanwhile, the resist walls 210b is tilted with respect to the ion travel direction of the ion beam 212 at the tilt angle α. FIG. 6C illustrates a side view of a resist wall 210b forming the tilt angle α with respect to the travel direction of the ion beam 212. FIG. 6D illustrates a top view of the resist trenches 210c aligned with the travel direction of the ion beam 212. As shown in FIGS. 6B and 6D, the device 200 is rotated by 180 degrees from its position in FIG. 6B (as a result of operation 120) to its position in FIG. 6D (as a result of operation 122).

At operation 123, the method 100 (FIG. 1B) implants ions (or ion species) into the resist walls 210b. It may also implant ions into the resist walls 210a incidentally. The resist walls 210b are trimmed substantially symmetrically from both sides (A-side and B-side in FIGS. 6A and 6C) by the operations 121 and 123. As a result, its width along the X direction shrinks from D2 to D2'. In some embodiments, the dimension D1 may be slightly enlarged. However, the reduction of the dimension D2 is substantially greater than the enlargement of the dimension D1. For example, the reduction of the dimension D2 may be at least 4 times or 5 times greater than the enlargement of the dimension D1 due to the directional application of the ion beam 212. In some embodiment, the dimension D2 is reduced by 5 nm to 6 nm, while the dimension D1 is enlarged by 1 nm or less. Thus, the method 100 effectively reduces the line end to line end spacing in the metal lines to be formed in the layer 203 (FIG. 2) while only slightly increasing the width of the same metal lines.

Figure 7A:
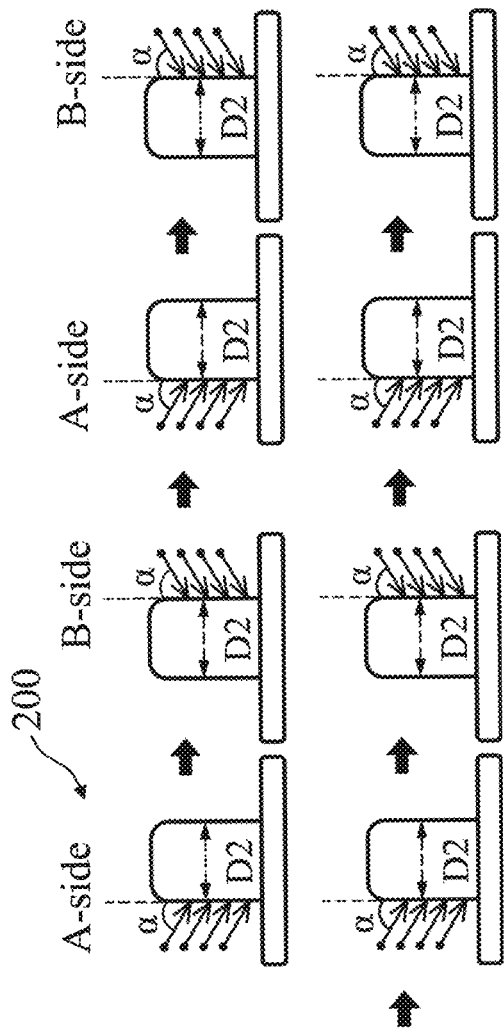
FIGS. 7A and 7B illustrate side view and top view of processing a target pattern for implementing another embodiment of the present disclosure.
Figure 7B:
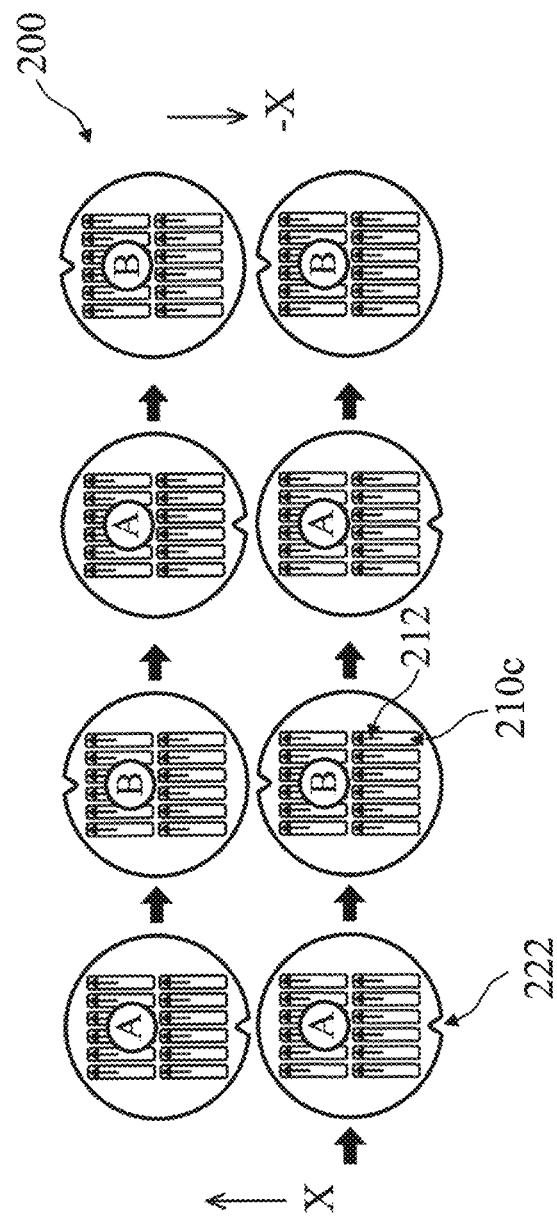

At operation 124, the method 100 (FIG. 1B) may repeat the operations 120 through 123. For example, the method 100 may rotate the device 200 (by operation 120) again by 180 degrees from its position at operation 123, implant ions (by operation 121) into the resist walls 210b, rotate the device 200 (by operation 122) by 180 degrees from its position at operation 120, and implant ions (by operation 123) into the resist walls 210b. The method 100 may repeat the operations 120, 121, 122, and 123 as many times as the processing time allows. For example, the method 100 may repeat the operations 120, 121, 122, and 123 two times, three times, four times, six times, eight times, or other suitable repetition in various embodiments. Each of the operations 121 and 123 only applies an equal fraction of the total ion dose as discussed above. FIGS. 7A and 7B illustrate side views and top views, respectively, of an embodiment of the operation 112 where the operations 120, 121, 122, and 123 are repeated four times.

Figure 8A:
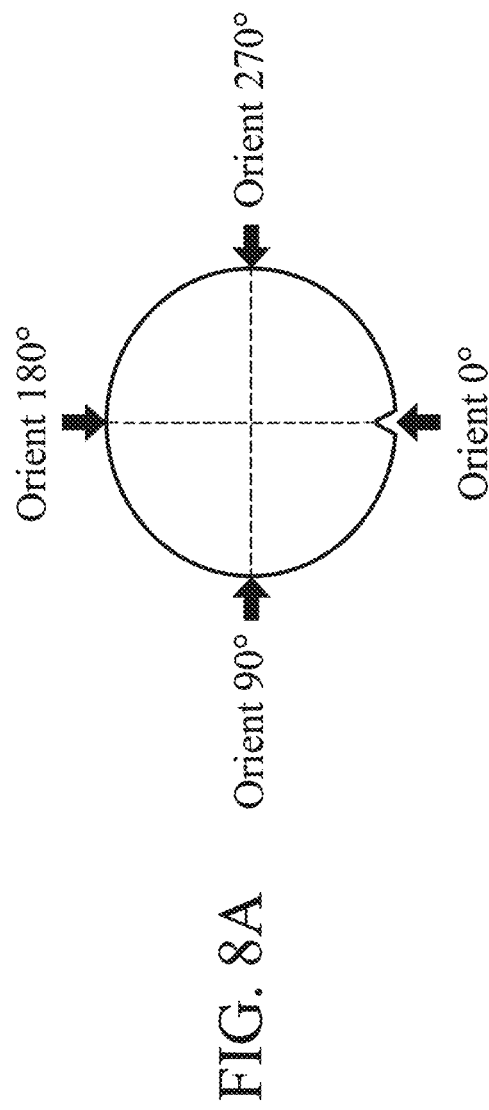
FIGS. 8A, 8B, and 8C illustrate rotating a structure during one or more embodiments of the present disclosure.
Figure 8B:
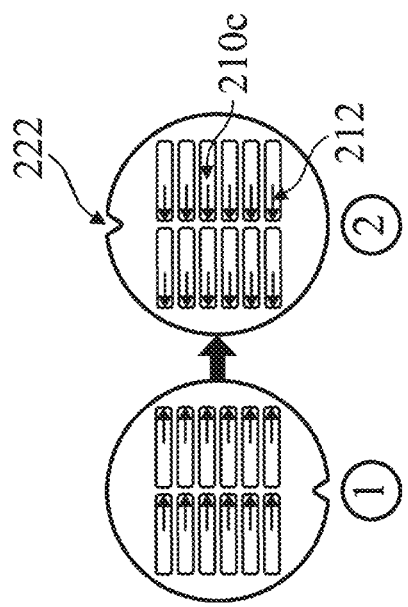
Figure 8C:
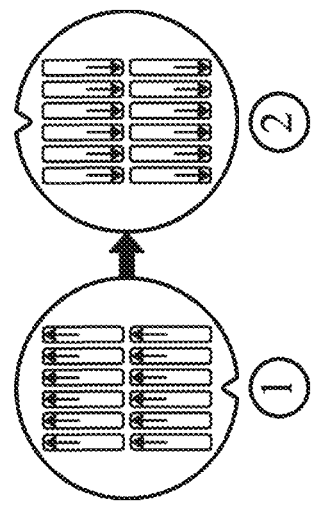

FIG. 8A illustrates four directions that the lengthwise direction of the resist trenches 210c may be set with respect to the direction marked by the alignment marker 222. The instances of "Orient 0°" and "Orient 180°" correspond to the examples illustrated in FIGS. 6A-6D and 7A-7B (which is repeated in FIG. 8B). The instances of "Orient 90°" and "Orient 270°" correspond to the example illustrated in FIG. 8C. Referring to FIG. 8C, the lengthwise direction of the resist trenches 210c is perpendicular to the direction marked by the alignment marker 222. For these instances, the rotation angle in the operation 120 (relative to the position resulted from the operation 110) is 90 degrees. In other words, the operation 120 rotates the device 200 by 90 degrees so that the ion travel direction of the ion beam 212 is aligned with the lengthwise direction of the resist trenches 210c.

Figure 1C:
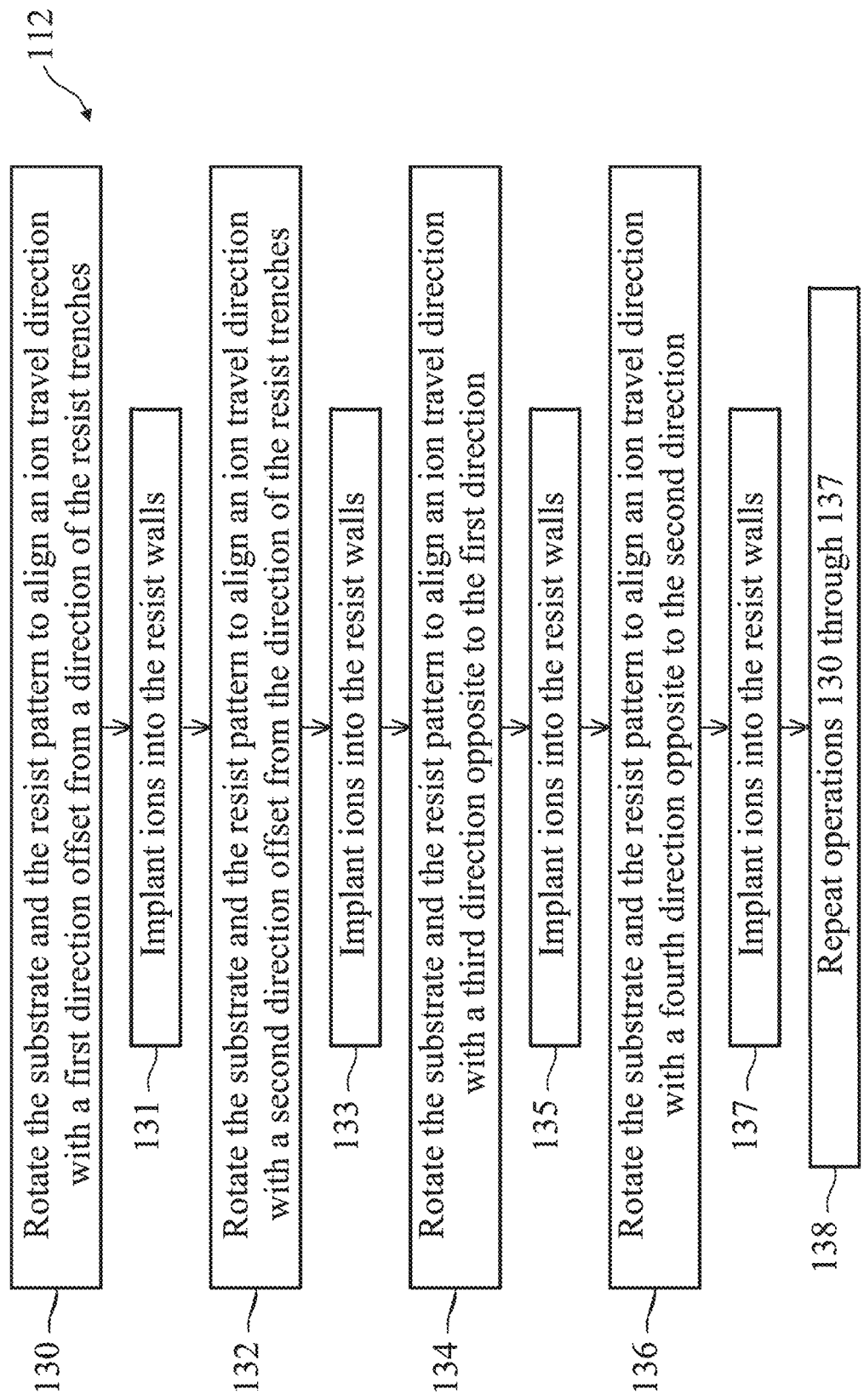
Figure 9A:
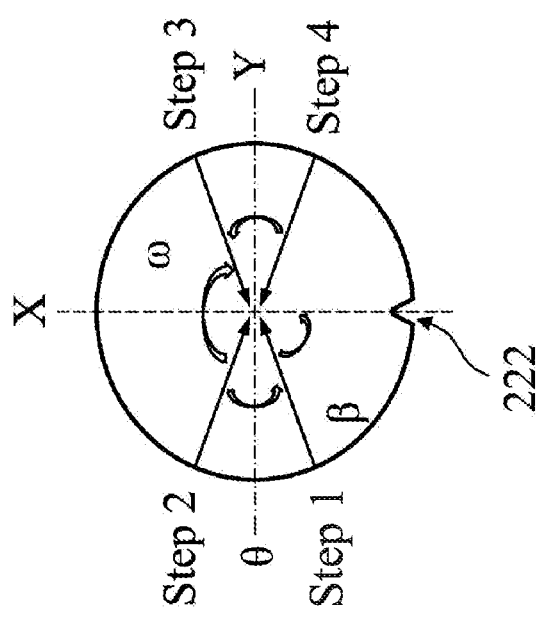
FIGS. 9A and 9B illustrate top views of processing a target pattern for implementing another embodiment of the present disclosure.
Figure 9B:
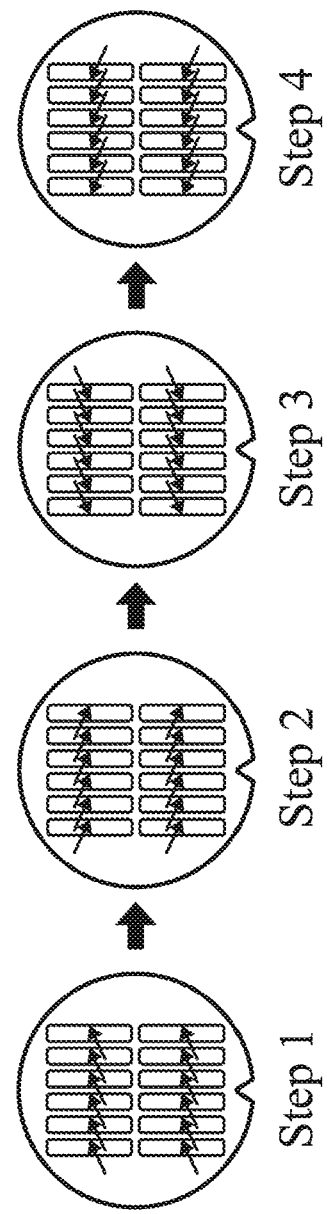

FIGS. 1C, 9A, and 9B show another embodiment of the operation 112. One difference between this embodiment and the ones shown in FIGS. 1B and 6A-8C is that the ion beam 212 forms a non-zero twist angle with respect to the X-Z plane (i.e., the plane that contains the directions X and Z) in this embodiment. In contrast, the ion beam 212 is in the X-Z plane in the embodiments shown in FIGS. 1B and 6A-8C, thus forms a zero twist angle with respect to the X-Z plane in those embodiments. However, the principles of the embodiments are the same—applying ion beams from two opposite directions to the resist walls 210b to reduce its thickness D2.

Referring to FIG. 1C, at operation 130, the method 100 rotates the device 200 with the resist pattern 210 to align the ion beam 212's travel direction with a direction offset from a lengthwise direction of the resist trenches 210c. As graphically illustrated in FIG. 9A, this involves rotating the device 200 by an angle β that is between 0 degree and 90 degrees from the position that is achieved by the operation 110. This angle β is a twist angle (as illustrated in FIG. 5) between the X-Z plane and the plane containing the normal to the top surface of the device 200 and the ion beam 212. The device 200 is still tilted by the angle α as discussed earlier. At operation 131, the method 100 (FIG. 1C) implants ions into the resist walls 210b and 210a. The ion species, energy, and dose are discussed above. This is indicated as "Step 1" in FIGS. 9A and 9B where ions are implanted from a twist angle β that is in the lower-left quadrant of the X-Y coordinate system.

At operation 132, the method 100 (FIG. 1C) rotates the device 200 by an angle θ from the position achieved by the operation 130. In the present embodiment, the angle θ is less than a sum of 90 degrees and a complementary angle of the angle β 0 (a complementary angle of the angle β equals to (90°−β)), and is greater than the complementary angle of the angle β. In other words, the device 200 is rotated such that ions are implanted from a twist angle that is in the upper-left quadrant of the X-Y coordinate system indicated by "Step 2" of FIGS. 9A and 9B. In an embodiment, the angle θ is twice of the complementary angle of the angle β. In other words, the ion travel directions in "Step 1" and "Step 2" are mirror reflection of each other with respect to the plane Y-Z. This helps reduce the thickness of the resist walls 210b more evenly along the Y direction. At operation 133, the method 100 (FIG. 1C) implants ions into the resist walls 210b and 210a as indicated by "Step 2" in FIG. 9A. The ion species, energy, and dose are discussed above.

At operation 134, the method 100 (FIG. 1C) rotates the device 200 by a twist angle ω from the position achieved by the operation 132 where the angle ω is a supplementary angle of the angle θ (i.e., ω+θ=180°), as indicated by "Step 3" in FIG. 9A. Effectively, the ion travel directions in "Step 1" and "Step 3" are opposite to each other. At operation 135, the method 100 (FIG. 1C) implants ions into the resist walls 210b and 210a as indicated by "Step 3" in FIGS. 9A and 9B, i.e., from the upper-right quadrant of the X-Y coordinate system. The ion species, energy, and dose are discussed above.

At operation 136, the method 100 (FIG. 1C) rotates the device 200 by the twist angle θ from the position achieved by the operation 134, as indicated by "Step 4" in FIG. 9A. effectively, the ion travel directions in "Step 2" and "Step 4" are opposite to each other. At operation 137, the method 100 (FIG. 1C) implants ions into the resist walls 210b and 210a as indicated by "Step 4" in FIGS. 9A and 9B, i.e., from the lower-right quadrant of the X-Y coordinate system. The ion species, energy, and dose are discussed above. Particularly, the ion dose of the operations 131, 133, 135, and 137 are equal fractions of a total dose as discussed above. In an embodiment, the angles β, θ, and ω are 75°, 30°, and 150° respectively. Of course, other configurations are possible that comply with the principles discussed above.

At operation 138, the method 100 (FIG. 1C) may repeat the operations 130, 131, 132, 133, 134, 135, 136, and 137. Particularly, the ion dose of the operations 131, 133, 135, and 137 are equal fractions of a total dose as discussed above. In some embodiments, the method 100 may execute the above operations in any order. For example, it may execute the operations in the order of "Step 1," "Step 2, "Step 3," and "Step 4;" or "Step 1," "Step 3, "Step 4," and "Step 2;" or in some other order. However, executing the operations in the order of "Step 1," "Step 2, "Step 3," and "Step 4" minimizes the number of total rotations (360-degree rotation) of the device 200 and may be more time efficient than other choices. Of course, the method 100 may execute the steps in clockwise order or counter-clockwise order.

Figure 1D:
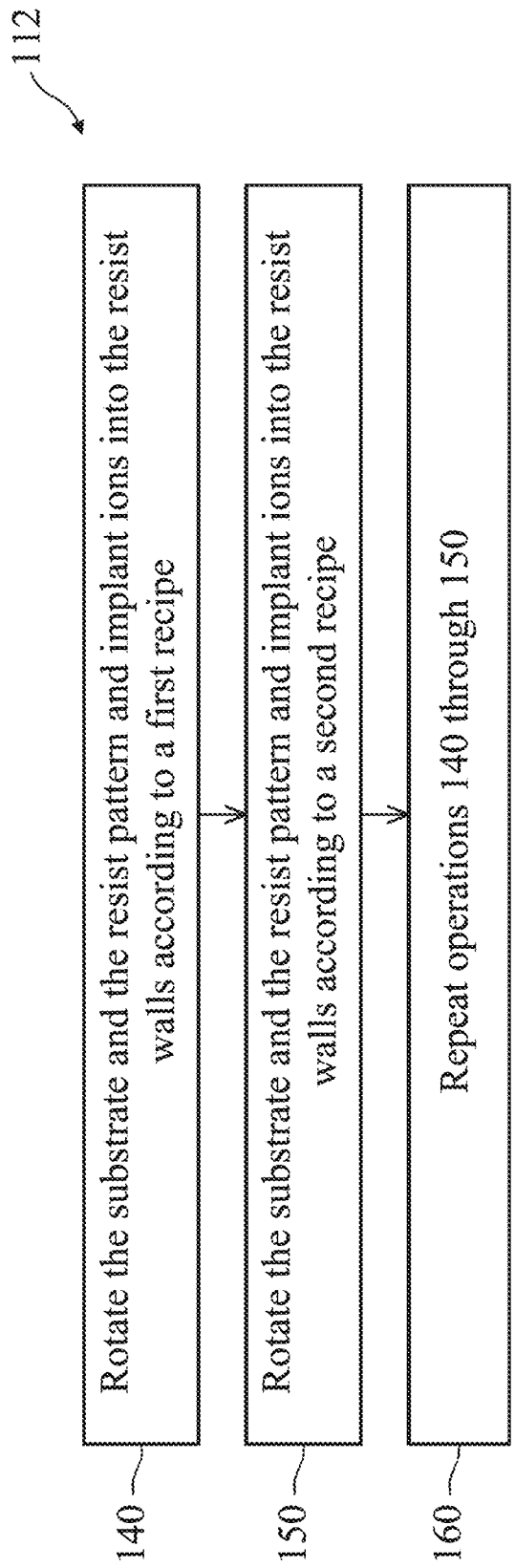
Figure 10:
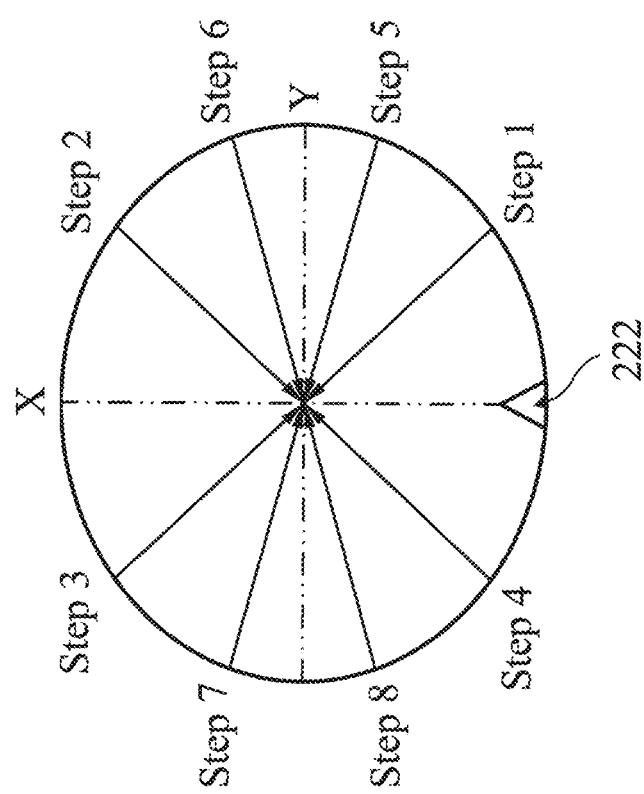
FIG. 10 illustrates a top view of processing a target pattern for implementing yet another embodiment of the present disclosure.

FIG. 1D and FIG. 10 show yet another embodiment of the operation 112. In this embodiment, the operation 112 uses a mix of two ion implantation recipes. For example, the two ion implantation recipes may be two instances of the embodiment described in FIG. 1B, two instances of the embodiment described in FIG. 1C, or an instance of the embodiment described in FIG. 1B and an instance of the embodiment described in FIG. 1C. Further, the two recipes are different in at least one aspect. For example, the two recipes may differ in their ion species, total ion doses, tilt angles, and/or twist angles. Referring to FIG. 1D, the operation 112 may include an operation 140 that rotates the device 200 and implant ions into the resist walls 210b (sometimes resist walls 210a) according to a first recipe and an operation 150 that rotates the device 200 and implant ions into the resist walls 210b (sometimes resist walls 210a) according to a second recipe different from the first recipe. The operation 112 may repeat the operations 140 and 150, as indicated by the operation 160. FIG. 10 shows an example where the two recipes are two instances of the embodiment described in FIG. 1C. Particularly, a first recipe implants ions into the resist walls 210b and 210a using the steps of "Step1," "Step2," "Step3," and "Step 4;" and a second recipe implants ions into the resist walls 210b and 210a using the steps of "Step5," "Step6," "Step7," and "Step 8." The twist angles of the two recipes are different. Other aspects of the two recipes may be the same or different. Further, the operation 112 may execute the steps of FIG. 10 in a clockwise fashion, such as "Step 1," "Step4, "Step8," "Step7," "Step3, "Step2," "Step6," and "Step5." Alternatively, the operation 112 may execute the steps of FIG. 10 in a counter-clockwise fashion. In an embodiment, the four steps of the same recipe are designed to be mirror reflections of each other in the X-Y coordinate system. For example, the steps "Step 1," "Step2, "Step3," and "Step4" are designed to be mirror reflection with respect to the X axis and Y axis, while the steps "Step5," "Step6, "Step7," and "Step8" are designed to be mirror reflection with respect to the X axis and Y axis. The mirror symmetry helps reduce the dimension D2 more evenly across the length of the resist walls 210b.

FIG. 12A illustrates a cross-sectional view of the resist walls 210a (or 210b) before being treated with the ion beams 212 in the operation 112, and FIG. 12B illustrates a cross-sectional view of the resist walls 210a (or 210b) after being treated with the ion beams 212 in the operation 112 for illustrating the effects of the operation 112. For example, the cross-sectional views may be taken along the A-A line in FIG. 3 for showing the changes in the resist walls 210a or may be taken along a line perpendicular to the A-A line in FIG. 3 for showing the changes in the resist walls 210b. Before being treated with the ion beams 212 in the operation 112, the resist walls 210a (or 210b) have a height h1, and the trenches 210c have a width w1 measured at half of the resist height and a width w2 at the bottom of the trenches 210c, where w1 is greater than w2. After being treated with the ion beams 212 in the operation 112, the resist walls 210a (or 210b) have a height h2, and the trenches 210c have a width w3 measured at half of the resist height and a width w4 at the bottom of the trenches 210c, where w3 is greater than w4. In an embodiment, the height h2 is smaller than the height h1 by about 10% to 15% due to the vertical treatment of the ion beam, the width w3 is greater than the width w1 by about 3% to about 5%, and the width w4 is greater than the width w2 by about 15% to about 20%. The change in the width at the bottom of the trenches 210c (w2 to w4) is greater than the change in the width at the half of the resist height (w1 to w3), both in terms of the ratio of increase (relative increase) and the absolute value increase. The sidewalls of the trenches 210c become more vertical due to the treatment.

Referring to FIG. 1A, after having treated the resist pattern 210 with the ion beams 212 in the operation 112, the method 100 transfers the treated resist pattern 210 to the structure 209 (FIG. 2, and particularly the layer 203) in operation 114. This may involve one or more dry (plasma) etching and other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, the etching processes may etch the layers 208, 206, and 204 using the treated resist pattern 210 as an etch mask and subsequently removing the resist pattern 210 by a wet etching process that uses a photoresist stripper, an aqueous alkaline solution, an amine-solvent mixture, or an organic solvent. This transfers the pattern into the layers 204 and 206 as shown in FIG. 12C. Then, the operation 114 may etch the layer 203 using one or more of the patterned layers 208, 206, and 204 as an etch mask, thereby transferring the resist trenches 210c to trenches in the layer 203, such as shown in FIG. 12D.

At operation 116, the method 100 (FIG. 1A) proceeds to forming a final pattern or device. In an embodiment, the resist pattern 210 is part of a metal line definition. To further this embodiment, the method 100 transfers the resist trenches 210c to the dielectric layer 203 as dielectric trenches; fills the dielectric trenches with one or more metallic materials; and performs a chemical mechanical planarization (CMP) process to the metallic materials to form metal lines 402 in the layer 203, such as shown in FIG. 12E. Due to the trimming of the resist walls 210b, the end to end spacing of the metal lines 402 (corresponding to dimension D2') is reduced.

Figure 13A:
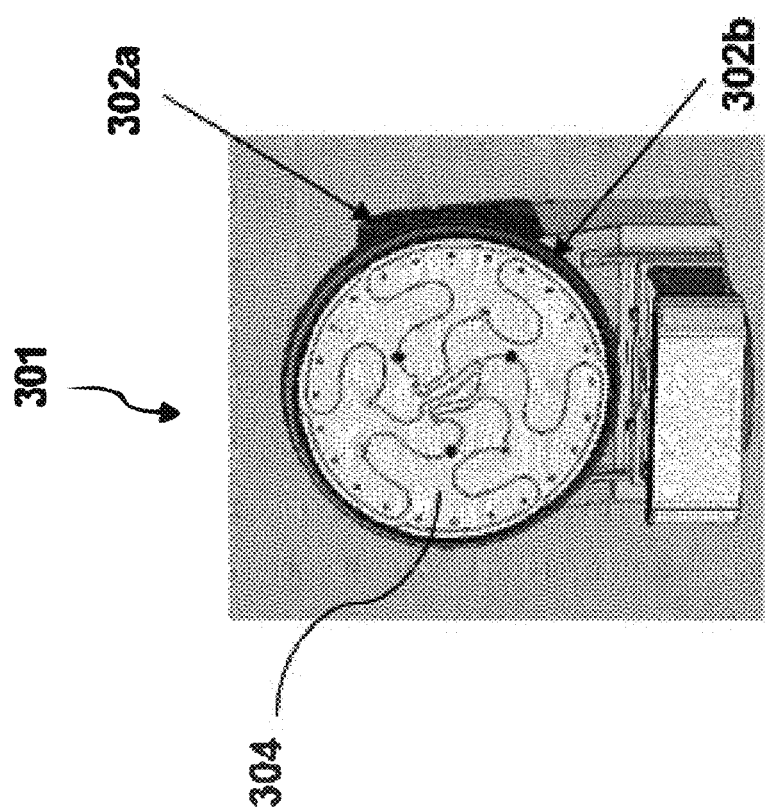
FIGS. 13A and 13B illustrate components of an ion implanter used for implementing one or more embodiments of the present disclosure.
Figure 13B:
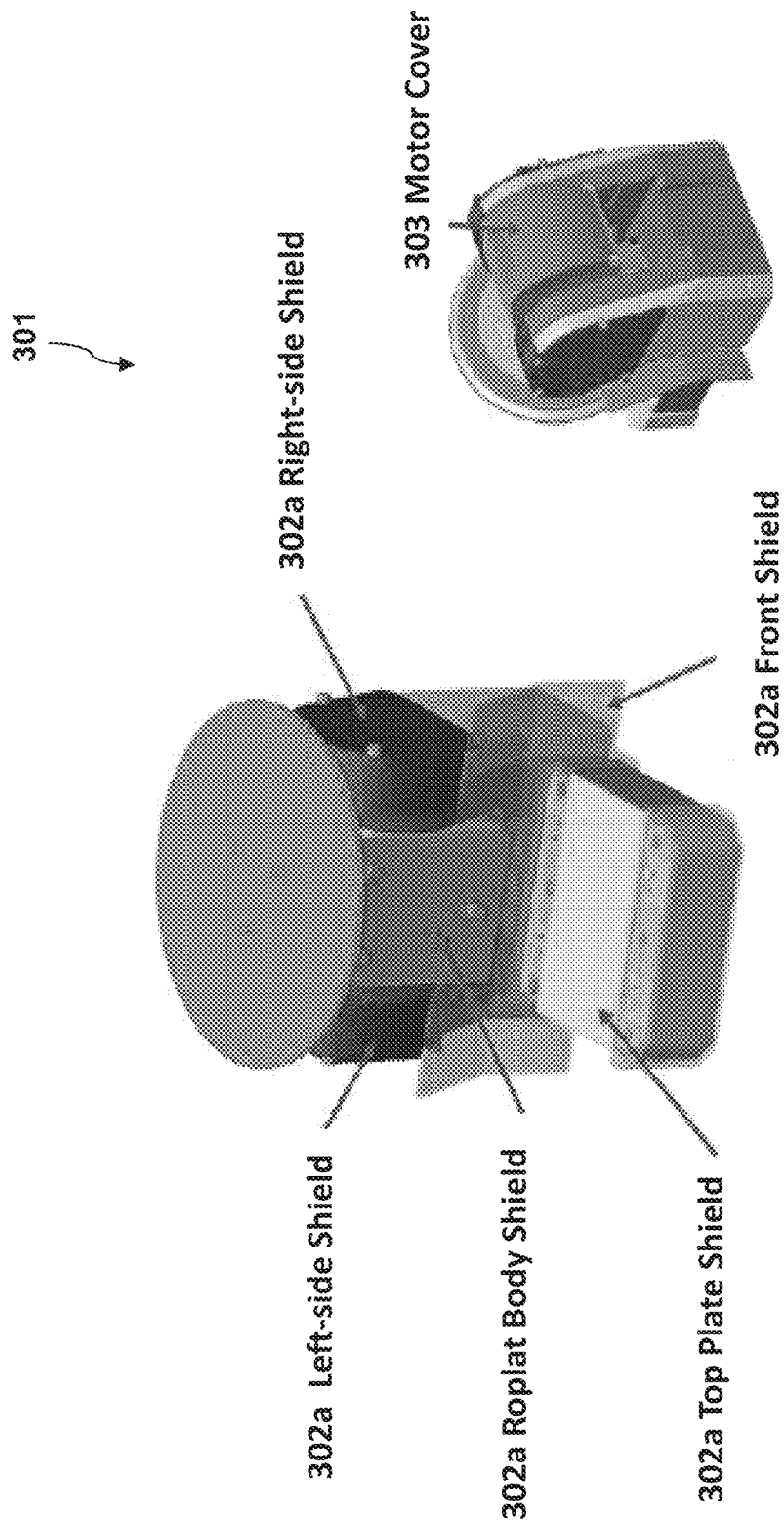

FIGS. 13A and 13B illustrate embodiments of the apparatus 301 used for the ion implanter 300, according to the present embodiment. Particularly, FIGS. 13A and 13B illustrate the shield 302 (FIGS. 11A and 11B) in more details. As illustrated in FIG. 11B, when the tilt angle is large (e.g., approaching 80 degrees), the ion beam 212 may hit parts (or components) under the platen 304, such as the roplat assembly 306 or the backside of the platen 304. This may damage the roplat assembly 306 and/or the platen 304. Further, materials of the roplat assembly 306 and the platen 304 (e.g., some metals) may be dislodged by the ion beam 212 and may cause contamination in the device 200. In the present embodiment, the shield 302 is added to the apparatus to protect the roplat assembly 306 and the platen 304 from the ion beam 212. In an embodiment, the shield 302 is made of graphite or a similar material. As shown in FIGS. 11B and 13A, the shield 302 may include sub-parts 302a and 302b. The shield 302a covers the body of the roplat assembly 306, while the shield 302b covers the edge of the platen 304. As shown in FIG. 13A, the shield 302b is of a ring structure that surrounds the rim of the platen 304. Referring to FIG. 13B, the left side of FIG. 13B shows a front view (facing the ion travel direction of the ion beam 212) of the roplat assembly 306 with various sub-parts of the shield 302a. In this embodiment, the shield 302a includes a left-side shield, a right-side shield, a front shield, a roplat body shield, and a top plate shield. The right side of FIG. 13B shows a back view of the roplat assembly 306. Particularly, there is a motor cover 303 (which may be considered as part of the shield 302) for protecting the motor from ion bombardments and/or other environmental elements.

Although not intended to be limiting, the present disclosure provides many benefits. For example, various embodiments of the present disclosure apply ion beams to resist walls from one or more pairs of opposite directions so as to reduce the line end to line end spacing in a metal layer as well as to reduce surface roughness (line edge roughness and line width roughness) of the resist walls. Embodiments of the present disclosure can be used in conjunction with double or multiple patterning methods to further reduce the pattern size. The present disclosure also discloses protective shields for ion implanter apparatus. The disclosed embodiments can be readily integrated into existing lithography processes and ion implantation tools to improve the same.

In one exemplary aspect, the present disclosure is directed to a method. The method includes forming a resist layer over a structure and patterning the resist layer, resulting in a resist pattern having elongated trenches oriented lengthwise substantially along a first direction and adjacent trenches being separated by resist walls along both the first direction and a second direction perpendicular to the first direction. The method further includes loading the structure and the resist pattern into an ion implanter so that a top surface of the resist pattern faces an ion travel direction of the ion implanter; tilting the structure and the resist pattern so that the ion travel direction forms a tilt angle with respect to an axis perpendicular to the top surface of the resist pattern; first rotating the structure and the resist pattern around the axis to a first position so that the ion travel direction is in a plane containing the first direction and the axis; and first implanting ions into the resist walls with the structure and the resist pattern at the first position. After the first implanting, the method further includes second rotating the structure and the resist pattern around the axis by 180 degrees to a second position; and second implanting ions into the resist walls with the structure and the resist pattern at the second position.

In an embodiment where the structure includes a patterning layer, the method further includes, after the second implanting, etching the patterning layer with the resist pattern as an etch mask.

In an embodiment of the method, the tilt angle is at least 60 degrees. In a further embodiment, the tilt angle is in a range from 60 degrees to 80 degrees.

In an embodiment of the method, the structure includes a silicon (100) substrate, and the first direction is along silicon <110> direction or silicon <100> direction. In an embodiment of the method, the tilting of the structure and the resist pattern is performed after the first rotating.

In an embodiment where the structure includes a silicon (100) substrate with an alignment marker indicating silicon <110> direction, the method further includes locating the alignment marker before the first rotating.

In an embodiment, the method further includes repeating the first rotating, the first implanting, the second rotating, and the second implanting.

In an embodiment of the method, the ions during the first and the second implanting include one or more of ion species selected from arsenic, boron, carbon, indium, boron fluoride ($BF_2$), germanium, gallium, fluorine, nitrogen, oxygen, phosphorus, silicon, xenon, argon, and silicon fluoride ($SF_3$).

In another exemplary aspect, the present disclosure is directed to a method that includes forming a resist pattern over a structure, wherein the resist pattern includes first resist walls oriented lengthwise substantially along a first direction and second resist walls oriented lengthwise substantially along a second direction perpendicular to the first direction, and the first and the second resist walls intersect. the method further includes loading the structure and the resist pattern into an ion implanter so that a top surface of the resist pattern faces an ion travel direction of the ion implanter; tilting the structure and the resist pattern so that the ion travel direction forms a tilt angle of at least 40 degrees with respect to an axis perpendicular to the top surface of the resist pattern; initially rotating the structure and the resist pattern around the axis to an initial position so that the ion travel direction is in an initial plane containing the first direction and the axis; first rotating the structure and the resist pattern around the axis from the initial position to a first position by a first angle that is less than 90 degrees; and first implanting ions into the first and the second resist walls with the structure and the resist pattern at the first position. After the first implanting, the method further includes second rotating the structure and the resist pattern around the axis from the first position to a second position by a second angle that is less than a sum of 90 degrees and a complementary angle of the first angle; and second implanting ions into the first and the second resist walls with the structure and the resist pattern at the second position.

In an embodiment, after the second implanting ions, the method further includes third rotating the structure and the resist pattern around the axis from the second position to a third position by a third angle that is a supplementary angle of the second angle; and third implanting ions into the first and the second resist walls with the structure and the resist pattern at the third position. In a further embodiment, after the third implanting ions, the method further includes fourth rotating the structure and the resist pattern around the axis from the third position to a fourth position by the second angle; and fourth implanting ions into the first and the second resist walls with the structure and the resist pattern at the fourth position. In a further embodiment, the method further includes repeating the first rotating, the first implanting ions, the second rotating, the second implanting ions, the third rotating, the third implanting ions, the fourth rotating, and the fourth implanting ions.

In an embodiment of the method, the second angle is twice of a complementary angle of the first angle. In an embodiment of the method, the tilt angle is in a range from 60 degrees to 80 degrees.

In an embodiment, the method further includes locating an alignment marker on the structure before the initially rotating the structure and the resist pattern.

In yet another exemplary aspect, the present disclosure is directed to a method. The method includes forming a resist pattern over a structure; loading the structure and the resist pattern into an ion implanter so that a top surface of the resist pattern faces an ion travel direction of the ion implanter; first implanting ions into the resist pattern using the ion implanter with a first recipe that includes applying a first ion dose to the resist pattern with the resist pattern being held at a first tilt angle and each of multiple first twist angles; and second implanting ions into the resist pattern using the ion implanter with a second recipe that includes applying a second ion dose to the resist pattern with the resist pattern being held at a second tilt angle and each of multiple second twist angles, wherein the first ion dose is different from the second ion dose, the first tilt angle is different from the second tilt angle, or the multiple first twist angles are different from the multiple second twist angles.

In an embodiment of the method, the resist pattern includes resist walls oriented lengthwise substantially along a first direction and the first implanting ions includes tilting the structure and the resist pattern so that the ion travel direction forms the first tilt angle with respect to an axis perpendicular to the top surface of the resist pattern; and for each twist angle in the multiple first twist angles, performing first rotating the structure and the resist pattern by the respective twist angle and first implanting ions into the resist pattern with the first ion dose.

In a further embodiment of the method, the second implanting ions includes tilting the structure and the resist pattern so that the ion travel direction forms the second tilt angle with respect to the axis perpendicular to the top surface of the resist pattern; and for each twist angle in the multiple second twist angles, performing second rotating the structure and the resist pattern by the respective twist angle and second implanting ions into the resist pattern with the second ion dose.

In an embodiment of the method, the multiple first twist angles include at least four angles, and the multiple second twist angles include at least four angles.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a resist layer over a structure;
    patterning the resist layer, resulting in a resist pattern having elongated trenches oriented lengthwise substantially along a first direction and adjacent elongated trenches being separated by first resist walls extending lengthwise along the first direction and second resist walls extending lengthwise along a second direction perpendicular to the first direction, wherein each of the elongated trenches is longer along the first direction than along the second direction;
    loading the structure and the resist pattern into an ion implanter so that a top surface of the resist pattern faces an ion travel direction of the ion implanter;
    tilting the structure and the resist pattern so that the ion travel direction forms a tilt angle with respect to an axis perpendicular to the top surface of the resist pattern;
    first rotating the structure and the resist pattern around the axis to a first position so that the ion travel direction is in a plane containing the first direction and the axis;
    first implanting ions into the second resist walls with the structure and the resist pattern at the first position;
    after the first implanting, second rotating the structure and the resist pattern around the axis by 180 degrees to a second position; and
    second implanting ions into the second resist walls with the structure and the resist pattern at the second position.

2. The method of claim 1, wherein the structure includes a patterning layer, further comprising:
    after the second implanting, etching the patterning layer with the resist pattern as an etch mask.

3. The method of claim 2, wherein the tilt angle is in a range from 60 degrees to 80 degrees.

4. The method of claim 1, wherein the structure includes a silicon (100) substrate, and the first direction is along silicon <110> direction or silicon <100> direction.

5. The method of claim 1, wherein the tilting of the structure and the resist pattern is performed after the first rotating.

6. The method of claim 1, wherein the structure includes a silicon (100) substrate with an alignment marker indicating silicon <110> direction, further comprising:
    before the first rotating, locating the alignment marker.

7. The method of claim 1, further comprising:
    repeating the first rotating, the first implanting, the second rotating, and the second implanting.

8. The method of claim 1, wherein the ions during the first and the second implanting include one or more of ion species selected from arsenic, boron, carbon, indium, boron fluoride (BF2), germanium, gallium, fluorine, nitrogen, oxygen, phosphorus, silicon, xenon, argon, and silicon fluoride (SF3).

9. The method of claim 1,
    wherein each of the elongated trenches has a first sidewall, a second sidewall, a third sidewall, and a fourth sidewall,
    wherein the first sidewall opposes the third sidewall, the second sidewall opposes the fourth sidewall, and a distance between the first and the third sidewalls is greater than a distance between the second and the fourth sidewalls,
    wherein during the first implanting of the ions, a plane containing the axis and the ion travel direction is perpendicular to the first sidewall, and during the second implanting of the ions, the plane containing the axis and the ion travel direction is perpendicular to the third sidewall.

10. A method, comprising:
    forming a resist pattern over a structure, wherein the resist pattern includes elongated trenches surrounded by first resist walls oriented lengthwise substantially along a first direction and second resist walls oriented lengthwise substantially along a second direction perpendicular to the first direction, and the first and the second resist walls intersect, wherein each of the elongated trenches is longer along the first direction than along the second direction;
    loading the structure and the resist pattern into an ion implanter so that a top surface of the resist pattern faces an ion travel direction of the ion implanter;
    tilting the structure and the resist pattern so that the ion travel direction forms a tilt angle of at least 40 degrees with respect to an axis perpendicular to the top surface of the resist pattern;
    initially rotating the structure and the resist pattern around the axis to an initial position so that the ion travel direction is in an initial plane containing the first direction and the axis;
    first rotating the structure and the resist pattern around the axis from the initial position to a first position by a first angle that is less than 90 degrees;
    first implanting ions into the first and the second resist walls with the structure and the resist pattern at the first position;
    after the first implanting, second rotating the structure and the resist pattern around the axis from the first position to a second position by a second angle that is less than a sum of 90 degrees and a complementary angle of the first angle; and
    second implanting ions into the first and the second resist walls with the structure and the resist pattern at the second position.

11. The method of claim 10, further comprising:
    after the second implanting ions, third rotating the structure and the resist pattern around the axis from the second position to a third position by a third angle that is a supplementary angle of the second angle; and third implanting ions into the first and the second resist walls with the structure and the resist pattern at the third position.

12. The method of claim 11, further comprising:

after the third implanting ions, fourth rotating the structure and the resist pattern around the axis from the third position to a fourth position by the second angle; and fourth implanting ions into the first and the second resist walls with the structure and the resist pattern at the fourth position.

13. The method of claim 10, wherein the second angle is twice of a complementary angle of the first angle.

14. The method of claim 10, wherein the tilt angle is in a range from 60 degrees to 80 degrees.

15. The method of claim 10, further comprising:

before the initially rotating the structure and the resist pattern, locating an alignment marker on the structure.

16. The method of claim 10, wherein the first and second resist walls form trenches having a first sidewall, a second sidewall, a third sidewall, and a fourth sidewall, wherein the first sidewall faces the third sidewall, the second sidewall faces the fourth sidewall, and a distance between the first and the third sidewalls is greater than a distance between the second and the fourth sidewalls, wherein the first implanting of the ions implants ions into the first and the fourth sidewalls and the second implanting of the ions implants ions into the third and the fourth sidewalls.

17. A method, comprising:

forming a resist pattern over a structure, the resist pattern having a trench surrounded by first resist walls extending lengthwise along a first direction and second resist walls extending lengthwise along a second direction perpendicular to the first direction, wherein the trench is longer along the first direction than along the second direction;

loading the structure and the resist pattern into an ion implanter so that a top surface of the resist pattern faces an ion travel direction of the ion implanter;

first implanting ions into the resist pattern using the ion implanter with a first recipe that includes applying a first ion dose to the resist pattern with the resist pattern being held at a first tilt angle and at multiple first twist angles one at a time; and second implanting ions into the resist pattern using the ion implanter with a second recipe that includes applying a second ion dose to the resist pattern with the resist pattern being held at a second tilt angle and at multiple second twist angles one at a time, wherein the first ion dose is different from the second ion dose, the first tilt angle is different from the second tilt angle, or the multiple first twist angles are different from the multiple second twist angles wherein each of the first and the second tilt angles is an angle between the ion travel direction and an axis perpendicular to the top surface of the resist pattern, and each of the first twist angles and the second twist angles is another angle formed between a plane containing the axis perpendicular to the top surface of the resist pattern and the first direction and another plane containing the axis perpendicular to the top surface of the resist pattern and the ion travel direction.

18. The method of claim 17, wherein the resist pattern includes resist walls oriented lengthwise substantially along a first direction, wherein the first implanting ions includes:

tilting the structure and the resist pattern so that the ion travel direction forms the first tilt angle with respect to an axis perpendicular to the top surface of the resist pattern; and for each twist angle in the multiple first twist angles, performing:

first rotating the structure and the resist pattern by the respective twist angle; and first implanting ions into the resist pattern with the first ion dose.

19. The method of claim 18, wherein the second implanting ions includes:

tilting the structure and the resist pattern so that the ion travel direction forms the second tilt angle with respect to the axis perpendicular to the top surface of the resist pattern; and for each twist angle in the multiple second twist angles, performing:

second rotating the structure and the resist pattern by the respective twist angle; and second implanting ions into the resist pattern with the second ion dose.

20. The method of claim 17, wherein the multiple first twist angles include at least four angles, and the multiple second twist angles include at least four angles.

* * * * *